(12) United States Patent
Kurokawa

(10) Patent No.: US 7,274,452 B2
(45) Date of Patent: Sep. 25, 2007

(54) ALIGNMENT APPARATUS

(75) Inventor: Shuji Kurokawa, Tokyo (JP)

(73) Assignee: Lintec Corporation, Tokyo (JP)

( * ) Notice: Subject to any disclaimer, the term of this patent is extended or adjusted under 35 U.S.C. 154(b) by 442 days.

(21) Appl. No.: 10/689,525

(22) Filed: Oct. 21, 2003

(65) Prior Publication Data
US 2004/0136000 A1    Jul. 15, 2004

(30) Foreign Application Priority Data

Oct. 24, 2002  (JP)  ............... 2002-309260
Jul. 20, 2003  (JP)  ............... 2003-203526

(51) Int. Cl.
*G01B 11/00* (2006.01)

(52) U.S. Cl. .................................... 356/401

(58) Field of Classification Search ........ 356/399–402, 356/614, 620, 622, 139.04, 124; 250/548
See application file for complete search history.

(56) References Cited

U.S. PATENT DOCUMENTS

| | | | | |
|---|---|---|---|---|
| 5,194,743 A * | 3/1993 | Aoyama et al. | ............ | 250/548 |
| 5,289,263 A * | 2/1994 | Kiyokawa et al. | ........... | 356/615 |
| 5,361,121 A * | 11/1994 | Hattori et al. | ................ | 355/50 |
| 5,438,209 A * | 8/1995 | Yamamoto et al. | ..... | 250/559.29 |
| 5,648,854 A * | 7/1997 | McCoy et al. | .............. | 356/399 |
| 6,124,215 A | 9/2000 | Zheng | ......................... | 438/760 |
| 6,187,093 B1 | 2/2001 | Zheng | ......................... | 118/52 |
| 6,519,036 B1 * | 2/2003 | Hickman | .................... | 356/399 |
| 6,710,886 B2 * | 3/2004 | Park et al. | ................... | 356/614 |
| 6,825,915 B2 * | 11/2004 | Yamauchi et al. | ............ | 355/72 |
| 2002/0101596 A1 | 8/2002 | Park et al. | ................... | 356/614 |

FOREIGN PATENT DOCUMENTS

| | | |
|---|---|---|
| CN | 1194456 A | 9/1998 |
| EP | 1 320 121 | 6/2003 |
| EP | 1 321 968 | 6/2003 |
| JP | 57-198642 | 12/1982 |

(Continued)

OTHER PUBLICATIONS

Hee-Sub Lee et al. "*A 12-inch wafer prealigner*", Microprocessors and Microsystems (Elsevier Science B. V.), vol. 27 (2003), pp. 151-158.

(Continued)

*Primary Examiner*—Tarifur Chowdhury
*Assistant Examiner*—Isiaka O. Akanbi
(74) *Attorney, Agent, or Firm*—Westerman, Hattori, Daniels & Adrian, LLP.

(57) ABSTRACT

An alignment apparatus 10 comprises a table 11 which is provided rotatably in a plane, and equipped with a loading plane 12A capable of sucking a wafer W, a shift mechanism 30 that moves the table 11 in the X- and Y-axis directions, and a sensor 50 that detects the position of the peripheral edge of the wafer W. The loading plane 12A is provided so as to come to a position inside the periphery of the wafer W. On the other hand, outside the table 11, a receiving member 15, which is positioned on the generally same plane as the loading plane 12A, is provided, and the receiving member 15 is provided with a plane configuration larger than the wafer W.

6 Claims, 3 Drawing Sheets

FOREIGN PATENT DOCUMENTS

| | | |
|---|---|---|
| JP | 60-146674 A | 8/1985 |
| JP | 11160031 A | 6/1999 |
| JP | 2002-148019 | 5/2002 |
| JP | 2002-148019 A | 5/2002 |
| JP | 2002-329769 | 11/2002 |

OTHER PUBLICATIONS

Austrian Patent Office Search Report dated May 12, 2004.
Office Action dated Apr. 7, 2006 issued in corresponding Chinese Application No. 200310104349.1.

* cited by examiner

ALIGNMENT APPARATUS

BACKGROUND OF THE INVENTION

1. Field of the Invention

The present invention relates to an alignment apparatus, and in particular, to an alignment apparatus, which prevents work from being damaged due to contact between the work and periphery edge of a table sucking the same, and is capable of detecting the position of the outer edge of the work with a high precision.

2. Related Art

Conventionally, the processing of work (semiconductor wafer (hereinafter, referred to as wafer)) includes, for example, a dicing process in which, after a circuit surface is formed on one side of a wafer, the wafer is cut into an appropriate chip size through various processes such that the rear surface thereof is polished with the circuit surface covered with a film, and the like.

In many processes as described above, an apparatus called wafer alignment apparatus (wafer positioning apparatus), of which object is to shift the center of wafer to a predetermined position and to align the chip alignment direction to a predetermined direction, is often incorporated into a variety of machines in the process.

In this apparatus, called aligner, a non-contact type, which does not come into mechanical contact with the most breakable wafer periphery edge, has become the main trend. The aligner is provided with such function that the central position and orientation of the wafer are obtained by performing calculation based on the wafer configuration characteristics and positional information obtained by an optical sensor and rotational and horizontal wafer shift means, and it is arranged so that the wafer is shifted to a predetermined position by the shift means.

More specifically, when a wafer is placed onto a generally flat wafer loading plane provided to a table by a transfer means such as a robot, the aligner turns the loading plane and wafer along with the table in a horizontal plane while sucking the wafer with a wafer suction means provided inside the wafer loading plane; a sensor head detects the periphery position of the wafer with respect to the rotational position of the table along with the position of an orientation mark indicating direction reference for chip alignment; and the wafer central position and the orientation mark are aligned to a predetermined position by rotating and shifting the table in X- and Y-directions in a horizontal plane based on the data output by the sensor, which outputs data for aligning the same, to the predetermined position; thus the wafer is made ready to be transferred to the next process.

The aligner is used in various machines such as a tester called prober, a wafer mounter which integrally attaches a ring frame and a wafer to each other with an adhesive film, and a dicing apparatus.

As for the type of the sensor head, in the case of an optical unit, of which sensor head comprises a light emitting side and a light receiving side, a transmission sensor system is often adopted in which a work is placed with its periphery portion being optically sandwiched by the light emitting side and the light receiving side, and the position of the periphery of the wafer is detected based on information of altered amount of the transmitted light.

In the above system, generally, it is arranged so that the periphery portion of the wafer is positioned outside the table being protruding in the air, and that the sensor head detects the position of the protruding portion. The aligner of this type is applicable with no problem to wafers of up to approximately 200 μm in thickness before dicing.

However, in these days, wafers are required to be extremely thin to 50 μm–200 μm in thickness. Owing to this, since polished wafer cannot maintain its plane configuration, in some cases, wafer periphery area protruding out of the table trails down due to its own weight. Consequently, in the alignment apparatus of conventional type, when the table is rotated, the wafer periphery area is apt to move up/down causing flip-flops by wind pressure due to the rotation. At this time, a large load is intensively applied to the contact position of the periphery area of the wafer with the periphery edge of the table due to the action of the principle of leverage having the fulcrum at the contact position and resulting in such problem that the surface of the wafer gets damaged. Such a problem occurs more frequently when the flip-flop is larger; i.e., when the rotation speed of the table is faster, or when the protruding width of the wafer is larger, resulting in such a problem that the setting of the rotation speed of the table and the size of the wafer are restricted. Further, due to the trail-down and flip-flop of the wafer, another problem occurs that the detection of the periphery position of the wafer becomes difficult, which decreases the detection accuracy by the sensor.

SUMMARY OF THE INVENTION

The present invention has been proposed in view of the above-described problems. Accordingly, an object of the present invention is to provide an alignment apparatus, which is capable of, even when a work cannot maintain its plane configuration, reliably detecting the outer edge position of the work, effectively preventing the work from being damaged by reducing up/down flip-flops in the periphery area of the work, and aligning the central position and an orientation mark of the work with a predetermined position.

In order to achieve the above-mentioned object, the present invention adopts such constitution that an alignment apparatus for aligning the central position and an orientation mark of a generally plate-like work with a predetermined position comprises:

a table, which is provided rotatably in a plane and equipped with a loading plane having suction holes for said work, a shift mechanism for shifting the table, and a sensor, which is disposed adjacent to the outer edge portion of said work, for detecting the position of the outer edge and outputting detected positional data for shifting said table to a predetermined position, wherein said loading plane is formed into a size so as to be positioned inside the periphery of said work; a receiving member is provided outside said table and is positioned on the generally same plane as said loading plane; and the periphery of the receiving member has a plane configuration so as to come to a position further outside the periphery of the work. According to the above constitution, it is possible to place the work on the table and the receiving member so as not to protrude out of the periphery of the receiving member. Thus, it is possible, unlike the conventional case, to prevent the trail-down in the periphery area of the work. By this arrangement, it is possible to prevent the flip-flop in the wafer periphery area during table rotation, thus it is possible to prevent the work from being damaged at the periphery edge of the table. And further, since the restriction in rotation speed of the table and size of the work is relieved, such effect that the degree of freedom in designing the alignment apparatus is obtained. Furthermore, since the trail-down and flip-flop of the work are prevented, it is possible to reliably detect the outer edge of the work with the sensor; thus, it is possible to align the central position and the orientation mark of the work with a high precision.

The present invention adopts such constitution that the sensor includes a light receiving element and a light emitting element disposed so as to optically sandwich the periphery portion of the work, and that said receiving member is formed using material having translucency. According to the above constitution, in detecting the outer edge position of the work, since the light emitted from the light-emitting element goes through the receiving member and is captured by the light receiving element, it is possible to determine the position of the light receiving element and the light emitting element despite the presence of the receiving member.

Further, a constitution may be adopted such that the light emitting element comprises a receiving member of glass-like scatterer, and is formed so as to reflect and project the light by allowing the light to enter the receiving member laterally. According to this constitution, since it is possible to form the light emitting element using the receiving member, it is possible to achieve space saving and simplification of the sensor structure.

Furthermore, it is preferred to adopt such constitution that the receiving member is detachably attached around the periphery of the table along with the above-described constitution. According to the constitution like this, it is possible to easily attach the receiving member to existing alignment apparatus. Also, by preparing receiving members of several sizes, even when the plane size of the work changes, it is possible to replace the receiving member in accordance therewith resulting in an increased versatility of the alignment apparatus.

Still further, the present invention may adopt such constitution that an alignment apparatus for aligning the central position and an orientation mark of a generally plate-like work with a predetermined position comprises:

a table, which is provided rotatably in a plane and equipped with a loading plane having suction holes for said work, a shift mechanism for shifting the table, and a sensor, which is disposed adjacent to the outer edge portion of said work, for detecting the position of the outer edge and outputting detected positional data for shifting said table to a predetermined position, wherein said table is formed out of material having translucency, and is formed into a size so that the periphery edge thereof comes to a position further outside the periphery of said work. According to the above constitution, it is possible to make the table simpler.

Still furthermore, the invention may adopt such constitution that the work comprises an ultrathin semiconductor wafer. According to this constitution, since the wafer is prevented from being damaged by incorporating the apparatus of the present invention into a manufacturing line of semiconductor wafer, it is expected that the chip yield and the like will be increased.

In this specification, the term "ultrathin" is used for semiconductor wafers of approximately 30 µm–150 µm in thickness.

DETAILED DESCRIPTION OF THE INVENTION

Embodiments of the present invention will be described below with reference to the drawings.

First Embodiment

Figure 1:
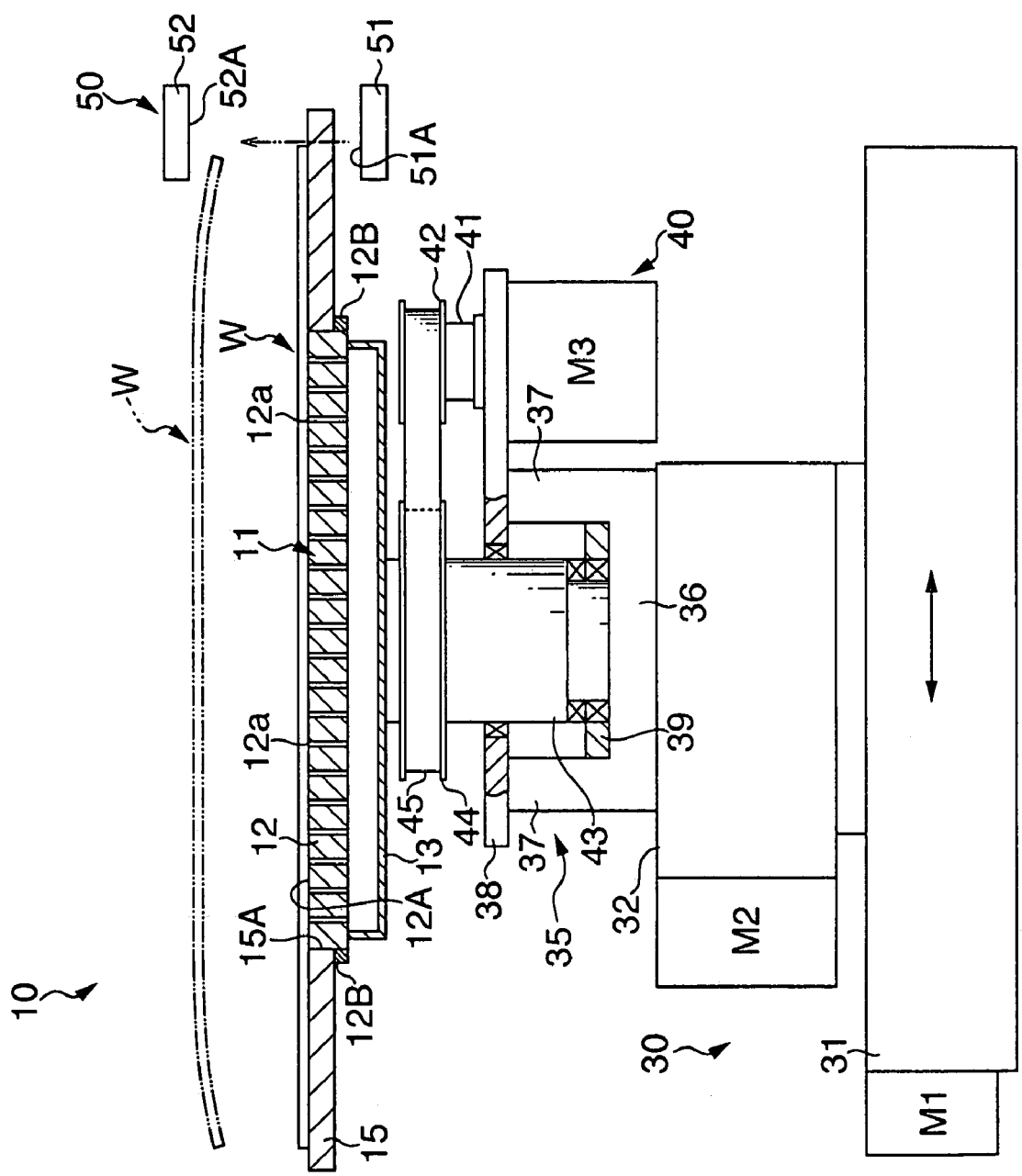
FIG. 1 is a front view schematically showing an alignment apparatus according to a first embodiment.

FIG. 1 is a front view schematically showing an alignment apparatus according to a first embodiment. Referring to FIG. 1, an alignment apparatus 10 comprises a table 11 for supporting a wafer W as a work having a generally disk-like shape, a shift mechanism 30 that shifts the table 11 in the X- and Y-axis directions, a rotation unit 40 that rotates the table 11 in a generally horizontal plane, and a sensor 50 disposed adjacent to the periphery portion of the wafer W. Here, the wafer W is formed extremely thin in thickness, and is provided with a V-notch W1, which indicates the crystalline orientation used for positioning the same, on the periphery thereof (right-edge in FIG. 2).

Figure 2:
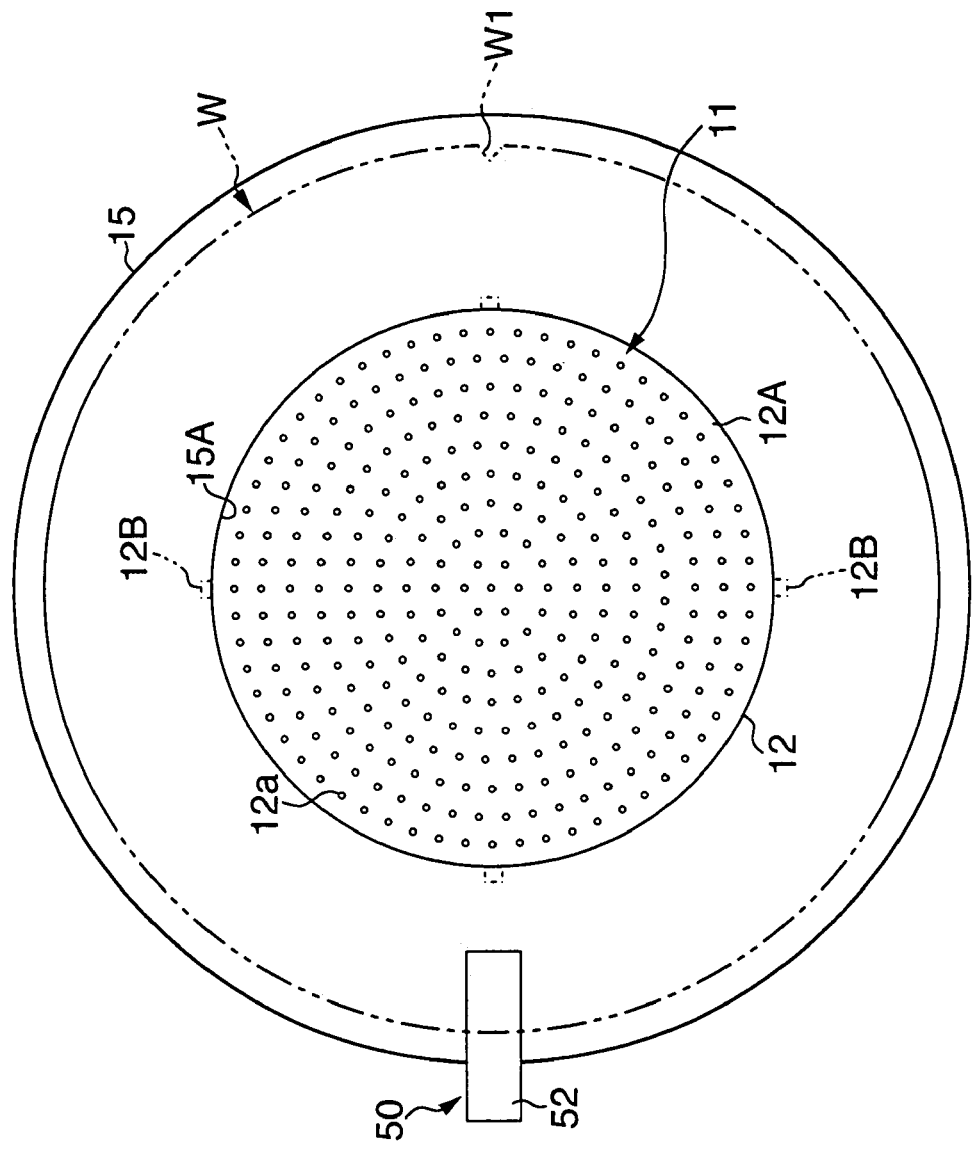
FIG. 2 is a plan view of a table according to the above embodiment.

The table 11 comprises, as shown in FIG. 2, a table main body 12 with a loading plane 12A having a disk-like shape viewed from the top, and a chamber 13 disposed on the lower face side of the table main body 12. The diameter or size of the loading plane 12A is formed smaller than that of the wafer W so that the periphery edge of the loading plane 12A is positioned inside the outer periphery edge of the wafer W. Accordingly, as shown in FIG. 2, the periphery portion of the wafer W projects by a predetermined amount out of the periphery of the loading plane 12A. In the surface of the loading plane 12A, a large number of suction holes 12a, which go through the same in the up-down direction, are formed so as to suck the wafer W, which is transferred and placed on the loading plane 12A, by exhausting the air from the chamber 13 via a vacuum pump or decompression pump (not shown). Here, attached at the periphery side of the table main body 12 is a receiving member 15 positioned on the generally same plane as the loading plane 12A.

According to the present embodiment, the receiving member 15 is formed using material having translucency such as quartz glass, but it is not limited thereto. The receiving member 15 is formed into a generally circular ring-like shape, and at the center thereof, a round hole 15A, which has an inner periphery surface along the periphery of the table main body 12. The receiving member 15 is formed into a plane shape which has a diameter larger than that of the wafer W. Also, the receiving member 15 is placed on a plurality of projections 12B provided on the periphery side of the table main body 12 and secured with screws detachably from the top of the table 11.

The shift mechanism 30 comprises an X-axis shift unit 31 provided movably in the right-left direction (X-axis direction) in FIG. 1, and a Y-axis shift unit 32, which is disposed at the upper portion of the X-axis shift unit 31, provided movably in the direction perpendicular to the drawing in FIG. 1 (Y-axis direction). The X- and Y-axis shift units 31, 32 are equipped with a known feed screw shaft mechanism, and are adapted so as to move with high precision along the X and Y axes by driving motors M1 and M2 respectively. Also, a table support member 35 is provided on the upper face side of the Y-axis shift unit 32. The table support member 35 comprises a base 36, a plurality of struts 37 extending upward from the base 36, an upper bearing plate 38 disposed at the upper end of these struts 37, and a lower bearing plate 39 disposed at the lower end side of the struts 37 so that a support axle 43, which will be described later, and the table main body 11 supported thereby can be rotated owing to the upper and lower bearing plates 38 and 39.

The rotation unit 40 comprises a motor M3 supported on the lower face side of an area of the upper bearing plate 38, which protrudes rightward in FIG. 1, a first pulley 42 fixed to an output axle 41 of the motor M3, a second pulley 44 positioned at the periphery of the support axle 43, which is provided on the lower face side of the chamber 13, and a belt 45 wrapped around between these first and second pulleys 42 and 44; and it is adapted so that the support axle 43 and the table 11 can be rotated in a horizontal plane by the rotation of the motor M3.

The sensor 50 comprises a type which has such function that image processing is available by a camera. Specifically, the sensor 50 comprises a light-emitting element 51 disposed below the receiving member 15 and a light-receiving element 52 disposed above the same. These elements 51, 52 are disposed at a position where the light emitting face 51A and the light receiving face 52A overlap with the outer edge portion of the wafer W, and it is arranged so that the position of the V-notch W1 is detected to perform the positioning of the wafer W.

Then, the entire operation in the first embodiment will be described.

First, a wafer W is transferred and placed onto the table 11 by a transfer apparatus (not shown), then the chamber 13 is decompressed to inhale the air therefrom via the suction hole 12a, and thus the wafer W is sucked and held on the loading plane 12A. Here, the central area of the wafer W is sucked by the loading plane 12A, and the periphery area of the wafer W is placed on the upper surface of the receiving member 15 without protruding out of the periphery of the receiving member 15.

Next, the motor M3 of the rotation unit 40 is driven to rotate the table 11. Owing to this rotation, the position of the V-notch W1 is detected by the light which goes from the light-emitting element 51 to the light-receiving element 52. Based on the detected data, the displacement amount between the central position of the wafer W and the origin of the X- and Y-axes is determined. Based on this determination, the X-axis shift unit 31 and the Y-axis shift unit 32 are driven to shift by a predetermined amount to align the central position and the orientation mark of the wafer W with a predetermined position respectively. After completing the positioning, the wafer W is sucked by the above-described transfer apparatus or other separate transfer arm (not shown), and the wafer W is transferred and placed in a predetermined state onto a table of an apparatus in the next process, i.e., for example, a mounter or dicing apparatus.

Thus, according to the above-described first embodiment, since the wafer W is placed on the receiving member 15 without allowing the periphery area thereof to protrude out of the periphery of the receiving member 15, it is possible to prevent trail-down or flip-flop of a wafer W in the periphery area thereof even when the wafer W of ultrathin type is the object to be handled. Owing to this arrangement, when the sensor 50 detects the position of the outer edge, it is possible to prevent positional detection error such as positional misalignment or defocusing; further, it is possible to prevent the lower surface of the wafer W from being damaged by the periphery edge of the table main body 12.

Second Embodiment

Figure 3:
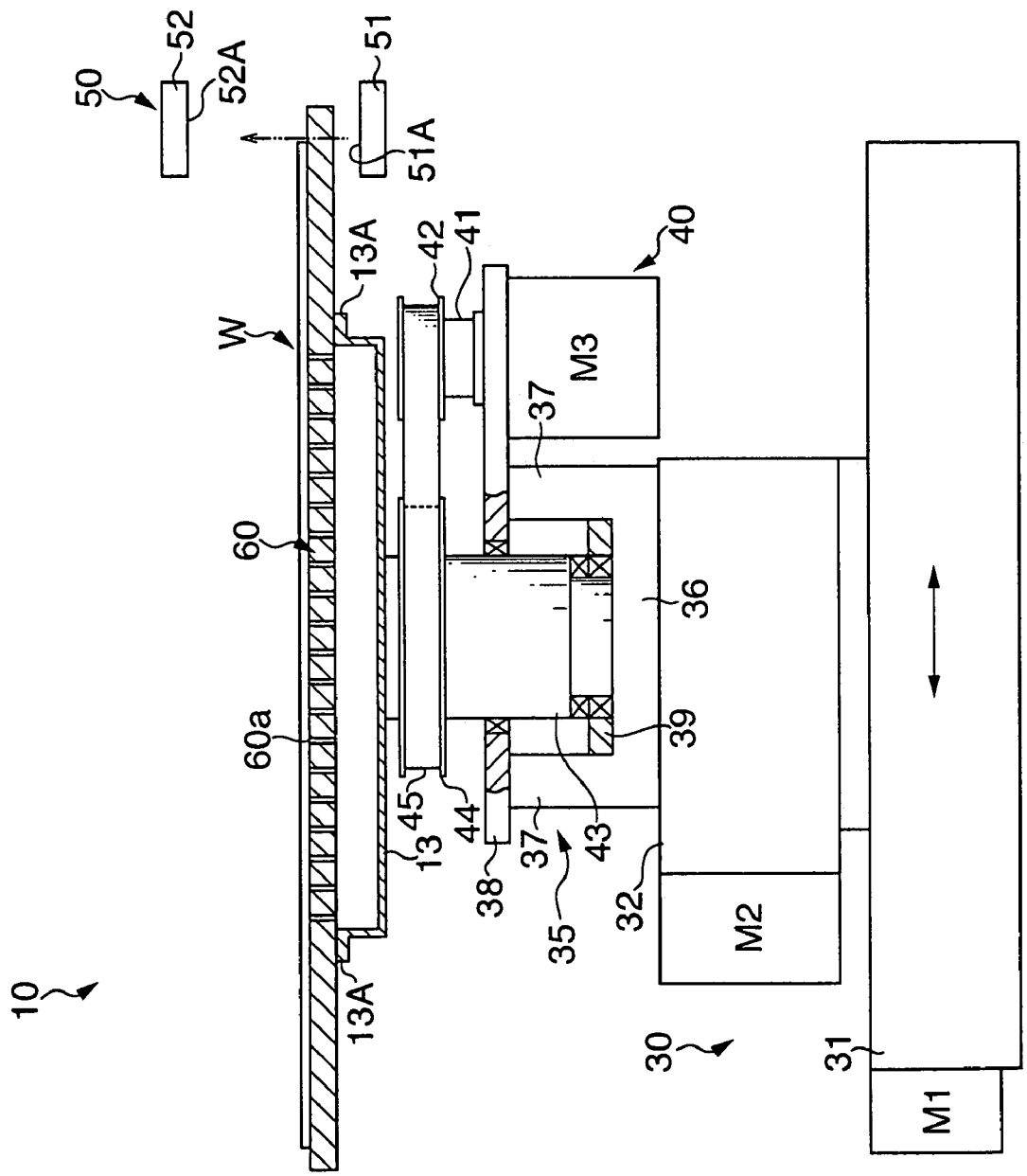
FIG. 3 is a front view schematically showing an alignment apparatus according to a second embodiment.

FIG. 3 shows an alignment apparatus according to a second embodiment of the invention. The second embodiment is characterized in that the table main body 12 and the receiving member 15 in the first embodiment are integrated into one unit. Specifically, a table 60 according to the second embodiment is formed out of material which has translucency entirely, for example, quartz glass, into such size that the periphery edge thereof comes to a position outside the periphery edge of the work W. Further, the table 60 is secured to a peripheral flange 13A forming a chamber 13 via screws or the like (not shown). In the area corresponding to the chamber 13, suction holes 60a are formed as with the first embodiment. Structures other than the above are substantially the same as those in the first embodiment. Accordingly, in FIG. 3, the items identical to those in the first embodiment are given the same reference numerals and symbols and the descriptions thereof are omitted.

According to the second embodiment as described above, in addition to the effect obtained by the first embodiment, the structure of the table 60 becomes simpler resulting in a reduction of the number of the components, and thus, such effect that the manufacturing cost of the apparatus can be reduced is additionally achieved.

In the above embodiment, the wafer W is the object to be handled. The invention is not limited to that. Other plate-like objects, which require centering or positioning, may be handled. Also, the wafer W is not limited to the type which is sucked on the lower side thereof, but also a type which is sucked on the upper side thereof may be handled.

Further, the sensor 50 is not limited to the above-described constitution. For example, such constitution may be adopted that positional displacement of the wafer W is detected by comparing the amount of light received by the light receiving element 52 with a predetermined amount of light to be received; alternatively, an area sensor, a line sensor or the like may be adopted. Furthermore, if the same feature as the above is obtained, the sensor 50 may be of a different reflection type or a transmission type. Still further, the receiving member 15 according to the first embodiment and the upper surface and/or lower surface of the periphery side of the table 60 according to the second embodiment may be optically roughened into a glass scatterer of frosted glass; and light from an illuminant such as a lamp or light from a light output port of a fiber light guide may be allowed to enter laterally; and the receiving member 15 or the table 60 itself is given a reflection function so that it can function as a light emitting element of the sensor 50. Owing to this arrangement also, the periphery portion of the wafer W is optically sandwiched by the receiving member 15 or table 60 as the light-emitting element and the light-receiving element 52.

Still furthermore, the material for the receiving member 15 and the table 60 is not limited to quartz glass. For example, a plastic plate such as an acrylic or polyvinylchloride plate may be used. In other words, it is sufficient that it has translucency at a level that the light receiving element 52 can captures the light emitted from the light-emitting element 51.

As described above, according to the invention, since the receiving member, which is positioned at generally the same plane as the loading plane, is provided outside the table and the receiving member has a plane configuration larger than the work, the periphery area of the work can be placed on the receiving member. Owing to this arrangement, since the periphery area of the work is prevented from trail-down and flip-flop, the surface of the work can be effectively prevented from being damaged; thus the positional detection and orientation detection of the work by the sensor can be maintained at a high precision.

Also, since the receiving member is formed out of material having translucency, even when the receiving member comes to a position between the light receiving element and the light-emitting element of the sensor, the light-receiving element can capture the light of the light-emitting element. Thus, despite the presence of the receiving member, it is possible to determine the position of each element. Here, in the case where the light-emitting element is formed out of the receiving member of a glass scatterer and it is arranged so that the receiving member can reflect and project the light which laterally enters the receiving member, the structure of the sensor can be simplified by using the receiving member.

Further, when the receiving member is provided detachably at the periphery of the table, it is possible not only to easily attach the receiving member to existing alignment apparatus, but also to replace the receiving member in accordance with the plane size of the work by preparing the receiving members of several sizes, and thus the versatility of the alignment apparatus is increased is advantageously achieved.

Furthermore, when the entire table is formed out of material having translucency, and the same is formed into a size that the periphery edge thereof comes to a position outside the periphery of the work, it is possible to form the table of the alignment apparatus into a simpler structure.

Still further, in the case where the work is an ultrathin semiconductor wafer, it is possible to prevent the wafer, which requires strict plane accuracy, from being damaged resulting in an increased yield ratio of chips.

What is claimed is:

1. An alignment apparatus for aligning the central position and an orientation mark of a generally plate-like work with a predetermined position, comprising:

a table, which is provided rotatably in a plane and equipped with a loading plane having suction holes for said work, a shift mechanism for shifting the table, and a sensor, which is disposed adjacent to the outer edge portion of said work, for detecting the position of the outer edge and outputting detected positional data for shifting said table to a predetermined position, wherein said loading plane is formed into a size so as to be positioned inside the periphery of said work; a receiving member is provided outside said table and is positioned on the generally same plane as said loading plane; and the periphery of the receiving member has a plane configuration so as to come to a position further outside the periphery of the work.

2. The alignment apparatus according to claim 1, wherein said sensor includes a light receiving element and a light emitting element disposed so as to optically sandwich the periphery portion of the work, and said receiving member is formed using material having translucency.

3. The alignment apparatus according to claim 2, wherein said receiving member is formed as a glass-like scatterer so as to reflect and project light from the light emitting element, allowing light to enter the receiving member laterally.

4. The alignment apparatus according to claim 1, 2 or 3, wherein said receiving member is detachably attached around the periphery of the table.

5. An alignment apparatus for aligning the central position and an orientation mark of a generally plate-like work with a predetermined position, comprising:

a table, which is provided rotatably in a plane and equipped with a loading plane having suction holes for said work, a shift mechanism for shifting the table, and a sensor, which is disposed adjacent to the outer edge portion of said work, for detecting the position of the outer edge and outputting detected positional data for shifting said table to a predetermined position, wherein said table is formed out of material having translucency, and is formed into a size so that the periphery edge thereof comes to a position further outside the periphery of said work.

6. The alignment apparatus according to claim 1, 2 or 3, wherein said work comprises an ultrathin semiconductor wafer.

\* \* \* \* \*